United States Patent [19]

Orengo et al.

[11] 4,446,385
[45] May 1, 1984

[54] VOLTAGE COMPARATOR WITH A WIDE COMMON MODE INPUT VOLTAGE RANGE

[75] Inventors: Gerard Orengo, Antibes; Michel Verhaeghe, Vence, both of France

[73] Assignee: International Business Machines Corporation, Armonk, N.Y.

[21] Appl. No.: 327,865

[22] Filed: Dec. 7, 1981

[30] Foreign Application Priority Data

Dec. 18, 1980 [EP] European Pat. Off. ........ 80430032.5

[51] Int. Cl.³ .............................................. H03K 5/24
[52] U.S. Cl. .................................... 307/355; 307/362
[58] Field of Search ............... 307/350, 362, 356, 355; 330/257, 261, 311

[56] References Cited

U.S. PATENT DOCUMENTS

| | | | |
|---|---|---|---|
| 3,895,307 | 7/1975 | Furuhashi | 330/261 |
| 4,216,435 | 8/1980 | Ahmed | 330/257 |
| 4,378,529 | 3/1983 | Dobkin | 330/257 |

Primary Examiner—John Zazworsky
Attorney, Agent, or Firm—Mitchell S. Bigel

[57] ABSTRACT

A voltage comparator circuit with a wide common mode input voltage range which extends beyond supply voltage parameter values. The comparator circuit utilizes an input stage having two input transistors, the emitter electrodes of which are connected to receive input signals and the collector electrodes of which are connected to two current sources. A current fixing circuit is coupled to the collector electrodes of said two input transistors and acts to fix the direct current in the collector circuits at a first value IO and the currents supplied by the current sources at a second value k IO, where k is greater than 2. An output stage is provided with two input circuits respectively connected to the collector electrodes of the two input transistors and with a logic circuit arrangement set to either one of two logic levels in accordance with the sign of the difference in the voltages applied to the pair of emitter electrodes of the two input transistors.

11 Claims, 3 Drawing Figures

VOLTAGE COMPARATOR WITH A WIDE COMMON MODE INPUT VOLTAGE RANGE

DESCRIPTION

1. Technical Field

The present invention relates to a voltage comparator with a wide range of common mode input voltages which extend beyond the range of voltages that exist between the supply voltages of the comparator.

Voltage comparators are devices widely used in a variety of systems such as computers, data collection systems, communication systems, etc. Presently, these systems are, in general, designed as highly integrated circuits. Consequently, it is necessary to include the comparators required in the system on chips even though the chips are only provided particular supply voltages.

2. Background Art

A great number of comparators is described in the technical literature, each one having its special characteristics. For example, the comparator described in the IBM Technical Disclosure Bulletin, Vol. 21, No. 10, Mar. 1979, pp. 4068–4069 is characterized by low power consumption. Those described in chapter AN-74 of the review "Linear Applications", Vol. 1, published by National Semiconductors, are characterized by an average switching speed and a low operational voltage.

These devices are provided with a differential input stage including two emitter-coupled transistors, the input signal being applied to the bases of these transistors. Consequently, the common mode input voltage range of all these comparators is limited to the values of the supply voltages; that is, for a comparator supplied with voltages of 0 and 8.5 volts, for example, the common mode input voltage range is limited to about 1 volt above or below these two values.

SUMMARY OF THE INVENTION

The object of the present invention is, therefore, to provide a comparator circuit in which the common mode input voltage range extends beyond the values of the supply voltage.

Another object of the present invention is to provide a comparator circuit characterized by having high common mode input voltages without having any effect on other circuit parameters.

A further object of the present invention is to provide a comparator circuit which can take negative common mode input voltages even though its supply voltages are positive.

The comparator circuit of the present invention is essentially composed of an input stage which acts to provide the circuit with the characteristic of exhibiting a common mode input voltage range extending beyond the values of the supply voltages. This input stage includes two first transistors of one type of conductivity whose emitters receive the voltages to be compared. Two current sources are respectively connected in series with the two first transistors. The current sources may comprise two second transistors of opposite conductivity to the two first transistors with the two second transistors having collectors respectively connected to the collectors of the two first transistors and having emitters connected to a first supply voltage. A current monitoring circuit includes two output lines, the first line of which is connected to the bases of the second transistors and the second line of which is connected to the bases of the first transistors in such a way that the collector direct currents of the second transistors are k times greater than the collector direct currents of the first transistors. Two connections are established at the common collector points of the first and second transistor and lead to an output stage which supplies a binary output signal depending on the sign of the difference of the voltages applied to the inputs.

If the first transistors are NPN transistors and if the supply voltage is positive, it is possible to extend the common mode input voltage range towards negative voltage values. On the other hand, if the first transistors are of the PNP type, it is possible to extend the common mode input voltage beyond the positive voltage values.

The foregoing and other objects, features and advantages of the invention will be apparent from the following, more particular description of several preferred embodiments of the invention, as illustrated in the accompanying drawings.

DETAILED DESCRIPTION OF THE DRAWINGS

Figure 1:
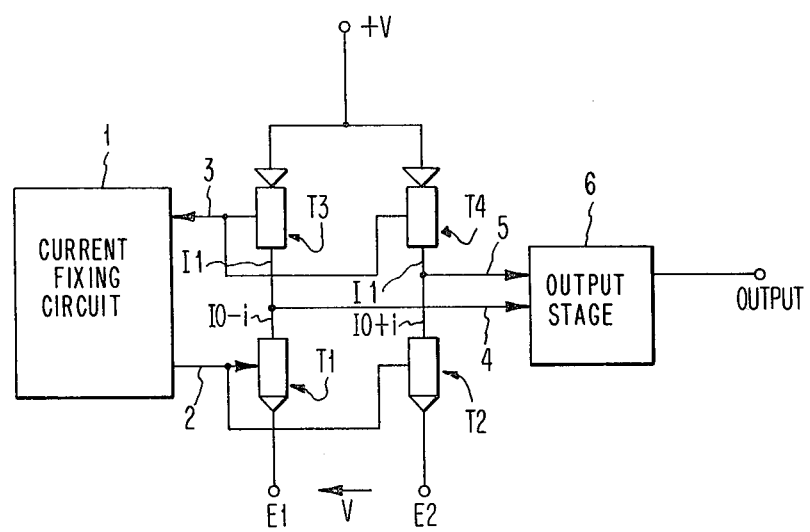
FIG. 1 shows a simplified diagram of a voltage comparator circuit illustrating the principles of the present invention.

FIG. 1 illustrates schematically the input stage of the comparator according to the present invention. It includes two input transistors T1 and T2 which in one embodiment are of the NPN type. The input voltages to be compared are applied to emitters E1 and E2 respectively of the two transistors. Transistors T1 and T2 are mounted in series with two current sources which, in a preferred embodiment, are transistors T3 and T4 of a conductivity opposite to that of the first transistors. The collectors of transistors T1 and T2 are connected to the collectors of transistors T3 and T4, respectively. A current fixing circuit 1 includes two output lines 2 and 3. These output lines are connected to the bases of transistors T1, T2 and T3, T4. The currents on lines 3 and 2 are such that when the same voltage is applied to emitters E1 and E2 the collector currents of T3 and T4 are equal and so are the collector currents of T1 and T2. In addition, collector currents I0 of T1 and T2 are lower than collector currents I1 of transistors T3 and T4, which may be expressed as follows:

$$I1 = kI0 \text{ with } k > 2.$$

The emitters of transistors T3 and T4 are connected to the supply voltage $+V$ which, in the embodiment described, is positive. The currents on output connections 4 and 5 tapped at the common collector points of transistors T1, T3 and T2, T4, respectively, are applied to output stage 6.

Figure 2:
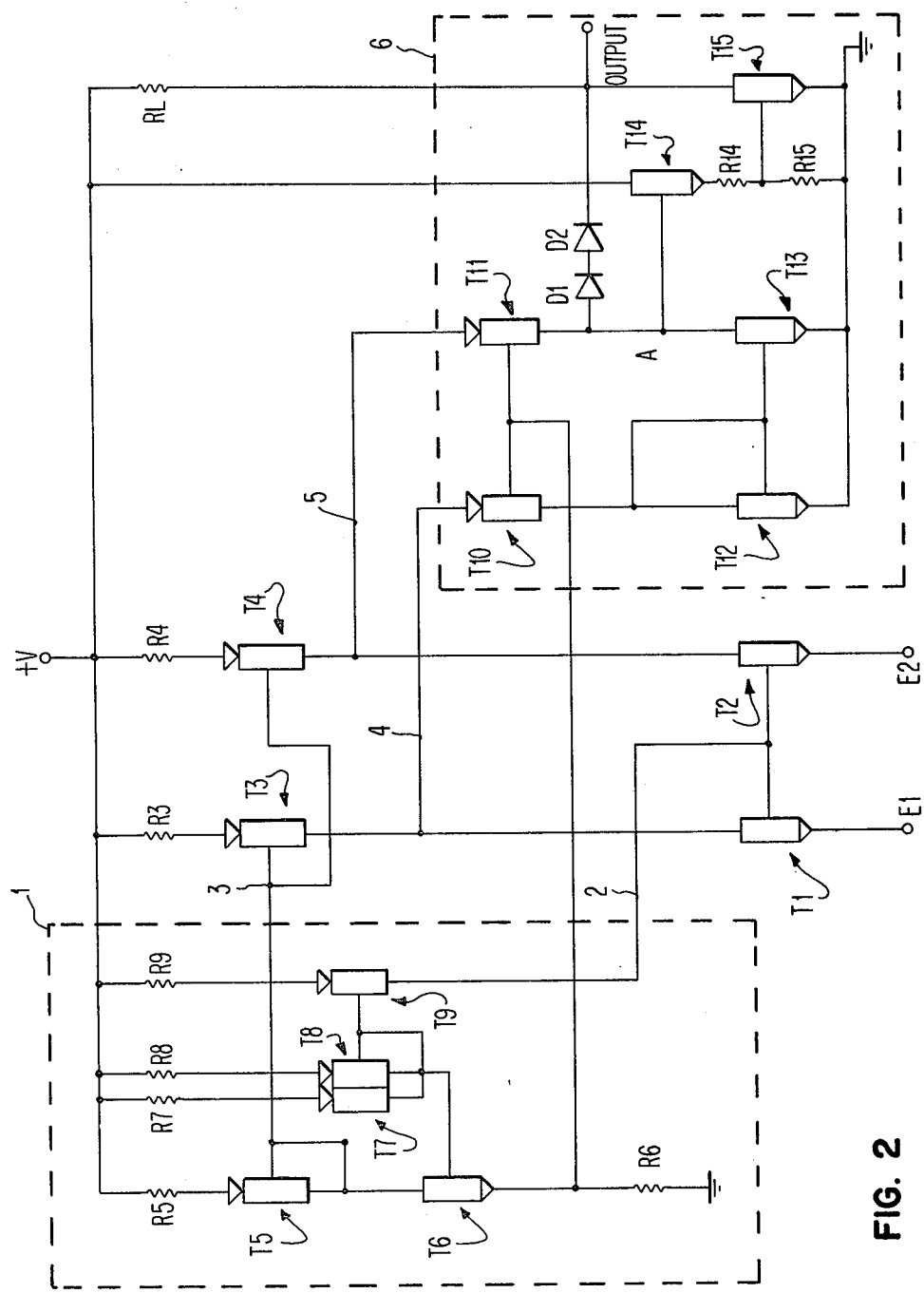
FIGS. 2 and 3 show two embodiments of the comparator circuit according to FIG. 1.

FIG. 2 shows one detailed embodiment, including an output stage and current fixing circuit, in accordance with the present invention. FIG. 2 shows an alternate detailed embodiment, including an output stage and current fixing circuit, in accordance with the present invention.

The circuit operation can be explained by applying the rules of superimposing direct currents I1 and I0, defined above, and the low current i resulting from a voltage unbalance at inputs E1 and E2. If the voltage at input E1 is higher than that at input E2, the collector current of transistor T1 will be I0−i and the collector current of transistor T2 will be I0+i. Conversely, if the voltage at input E1 is lower than that at input E2, the collector current of transistor T1 is I0+i and that of transistor T2 is I0−i.

It is possible to show that current i, which may be either positive or negative, is a function of the difference in voltage v between inputs E1 and E2 and that consequently it may be used in the output stage to supply a logical up or down level depending on the sign of the difference between the voltages at inputs E1 and E2. This may be expressed as:

$$v = V_{BE}(T2) - V_{BE}(T1)$$

$$v = kT/q \ln \frac{I0+i}{I0-i}$$

$V_{BE}(T1)$ and $V_{BE}(T2)$ are the base-emitter voltages of transistors T1 and T2, respectively;
k is the Boltzmann constant;
q is the electron charge
T is the temperature in Kelvin degrees.

By developing the aforegoing equation, and on condition that i is much lower than I0, the expression:

$$v = \frac{I0/2}{kT/q}$$

is obtained.

This verifies that i is the image of the difference in the input voltages. In particular, if the input voltage at E1 is higher than the input voltage at E2, i will be positive. Conversely, if the input voltage at E2 is higher than the input voltage at E1, i will be negative.

The current at output connection 4 is:

$$kI0-(I0-i)=(k-1)I0+i$$

the current at output connection 5 is:

$$kI0-(I0+i)=(k-1)I0-i.$$

Connections 4 and 5 are connected to an output stage 6 which supplies the associated logical level depending on the values of the voltages to be compared.

The main advantage of the circuit illustrated in FIG. 1, which is characterized by the high common mode voltage (which will, in the following, be evaluated with reference to FIG. 2), is the fact that the inputs are floating, the input stage being fed by only one voltage. Furthermore, none of the points at which the voltages may vary, as for example the emitters and bases of transistors T1 and T2, has to meet the isolation rules to be taken into account when integrating the device according to the conventional "planar" method. These rules can be summarized as follows:
the collector voltage of an NPN transistor with respect to the substrate must always be positive or zero;
the voltage of the epitaxial bed of the resistors with respect to the substrate must always be positive or zero; and
the base voltage of a PNP transistor with respect to the substrate must always be positive or zero.

Referring to FIG. 2, the complete diagram of a comparator according to the invention, including a current fixing circuit and an output stage, will be described in the following. The elements illustrated in FIG. 1, which may also be found in FIG. 2, have the same references.

In the same manner as shown in FIG. 1, the two input transistors T1 and T2 of FIG. 2 are mounted in series with the current sources comprising transistors T3 and T4 associated with resistors R3 and R4 and having their emitters connected to the positive supply voltage +V.

The current fixing circuit 1 includes transistors T5 to T9 and resistors R5 to R9 mounted in the following manner. Transistor T5, which is of the same conductivity type as transistors T3 and T4 is arranged as a current mirror with these transistors. In particular, the emitter of transistor 5 is connected to voltage +V via a resistor R5 (having the same value as resistors R3 and R4) while its base and collector are connected together. In addition, the bases of T3, T4 and T5 are interconnected. Due to this arrangement, the base-emitter voltages of the three transistors are equal and consequently their emitter currents are also equal then, collector currents of T3 and T4 are equal and approximately equal to collector currents of T6 (due to the base currents of T6, T3, T4).

The collector of NPN transistor T6 is connected to the collector of transistor T5, and its emitter is connected to ground via resistor R6. Since the collector current of T6 equals I1, its base current is I1/βn, βn being the gain of NPN transistor T6. Transistor T6 is is of the same conductivity type transistors T1 and T2 which thus have the same gain βn.

The base currents of transistors T1 and T2 are generated from current I1/βn through a second current mirror including transistors T7, T8, and T9. The collectors of transistors T7 and T8 are both connected together and to the base of transistor T6. The collectors of transistors T7 and T8 are also connected to their bases and the emitters of transistors T7 and T8 are connected to the positive voltage +V via resistors R7 and R8. The base of transistor T9 is connected to the bases of transistors T7 and T8 while the emitter of transistor T9 is connected to voltage +V via a resistor R9 of the same value as R7 and R8. The collector of transistor T9, on the other hand, is connected to the bases of transistors T1 and T2. As a result, the collector current of transistor T9 is equal to I1/2βn.

The base currents of the two transistors T1 and T2 are, therefore, equal to I1/4βn. Since transistors T1 and T2 have the same gains as transistor T6, their collector currents are equal to I1/4. Thus, the current obtained is I1=kI0=4I0.

Other ratios between currents I1 and I0 can be obtained. It is sufficient to choose the emitter-resistor ratio and to mount further transistors in parallel with T7 and T8.

The output stage 6 receives, via connections 4 and 5, the currents 3I0+i generated by applying the voltages to be compared to inputs E1 and E2. The emitters of the two PNP transistors T10 and T11 are connected to connections 4 and 5, respectively, and their bases are interconnected and biased by the voltage tapped from the emitter of transistor T6. This voltage is equal to $+V-2V_{BE}$ and $V_{BE}$ is approximately equal to 0.7 volt.

The collectors of transistors T10 and T11 are connected to the collectors of the two NPN transistors T12 and T13. The bases of transistors T12 and T13 are connected together and their emitters are grounded. The collector of T12 is connected to the bases of T12 and T13. The collector of transistor T13 is connected to the base of NPN transistor T14 whose emitter is series-grounded via the two resistors R14 and R15. The collector of transistor T14 is connected to voltage +V. The emitter of NPN output transistor T15 is grounded and its base is connected to the common point of resistors R14 and R15 whose values have been chosen in such a way that the voltage at the emitter of T14 is equal to $1.5 V_{BE}$ ($V_{BE}$ being the base-emitter voltage of a transistor) when T14 and T15 are conductive. The output is tapped from the collector of transistor T15 which is connected via a load resistor RL to voltage +V. Two anti-saturation diodes D1 and D2 are mounted in series between the collectors of transistors T11 and T15, the anode of D1 being connected to the collector of transistor T11 and the cathode of D2 being connected to the collector of transistor T15.

The output stage operates as follows. As explained with reference to FIG. 2, if VE1 is higher than VE2, the current on connection 4 is 3I0+i and on connection 5 is 3I0−i. Current 3I0+i flows in the collector path of transistor T12 and is reproduced in the collector path of transistor T13. Current 3I0−i at the emitter of T11 can be found in the collector path of the same transistor. Consequently, no current is delivered to the base of transistor T14, which is off. Transistor T15, in turn, is also off, and the output voltage is at the up level.

Conversely, if voltage VE1 is lower than VE2, the current at the emitter of T10 is 3I0−i and this current is reproduced in the collector path of T12. The current at the emitter of transistor T11 is 3I0+i and consequently a current is delivered to the base of transistor T14 which becomes conductive. Transistor T15 also becomes conductive and the output voltage is at the down level.

In this structure, the common mode input voltage range is mainly limited by the breakdown voltage of the transistors. It is to be noted that the negative limiting value of the common mode input voltage is equal to:

$$+V - [BVCEO (T9) + V_{BE} (T1 \text{ or } T2)]$$

where BVCEO (T9) is the breakdown voltage between the collector and the emitter of transistor T9.

The above-mentioned breakdown voltage depends, of course, on the technology used to produce the semiconductor structure. By way of example, a collector-emitter breakdown voltage of 13 volts and a supply voltage of 5 volts result in a lower limit of the common mode input voltage range of −8.7 volts. The upper limit of this range is $+V - 2V_{BE}$ which, for +V=5 volts, gives an upper limit value of 3.6 volts.

The principle of the present invention can also be applied to transistors having the opposite type of conductivity, especially for input transistors which can be of the PNP type. It is clear that this implies a change in the type of conductivity for certain other transistors of the arrangement.

Figure 3:
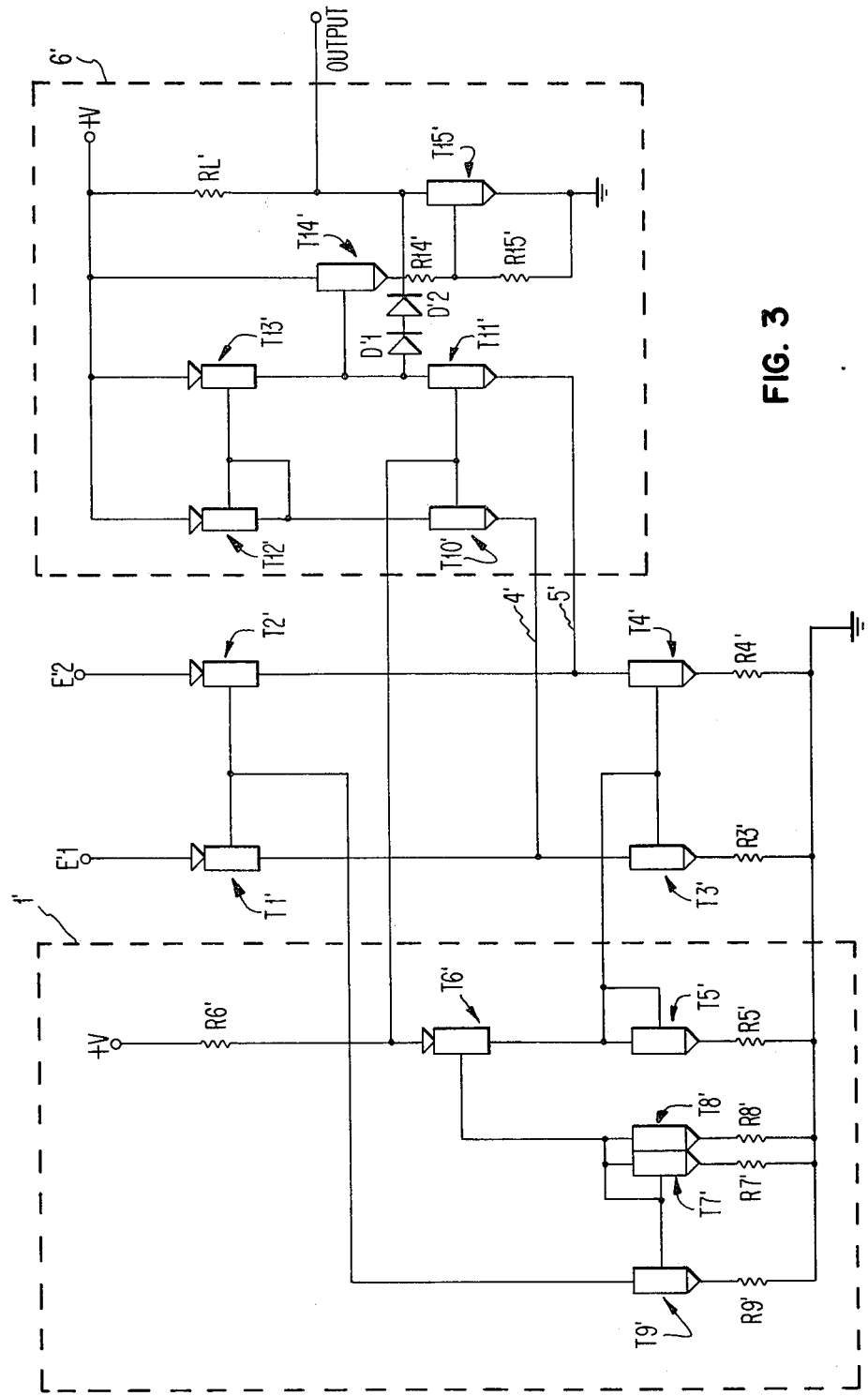

FIG. 3 illustrates a diagram of a comparator having transistors of a conductivity opposite to that of FIG. 2. The elements which perform the same functions as that in FIG. 2 have the same references but primed.

The input transistors T2' and T1' are PNP transistors whose emitters receive the voltages to be compared. Their collectors are connected to the collectors of two NPN transistors T4' and T3' whose emitters are grounded via resistors R4' and R3'. The current fixing circuit includes transistors T5' and T9' of a conductivity opposite to the corresponding transistors of FIG. 2. The emitters of the NPN transistors T5', T7', T8' and T9' are grounded by resistors R5', R7', R8' and R9' and the emitter of PNP transistor T6' is connected to the positive supply voltage via resistor R6'.

Connections 4' and 5' are connected to the emitters of NPN transistors T10' and T11'. The collectors of the two PNP transistors T12' and T13' are connected to the collectors of transistors T10' and T11', and their emitters are connected to the positive voltage. The output stage is based on the same principle as that shown in FIG. 2. The output transistor T14' is of the NPN type with its collector connected to voltage +V and its emitter grounded via resistors R14' and R15'. Transistor T15' is of the same type of conductivity as transistor T15 and is arranged as shown in FIG. 2.

The circuit illustrated in FIG. 3 operates as the circuit in FIG. 2, i.e. the current fixing circuit induces a current 4I0 to flow in the collector paths of transistors T3' and T4' and a current I0 to flow in the collector paths of transistors T1' and T2'.

If voltage VE1' is higher than VE2', the collector current of T1' is I0+i and the collector current of T2' is I0−i. Consequently, the current on connection 4' is 3I0−i and that on connection 5' is 3I0+i.

The collector current 3I0i of transistor T10' is reproduced by the arrangement of transistors T12' and T13' in the collector path of transistor T13'. Thus, current 3I0+i flows in the collector path of transistor T11' and consequently transistor T14' is off (as is transistor T15') and the output is at the up level. Conversely, if voltage VE1' is lower that VE2', transistor T14' is conductive and the output is at the down level.

The common mode input voltage range in this arrangement is different. It extends towards positive values above voltage +V between $2V_{BE}$ and $[BVCEO + V_{BE}]$ with respect to ground.

By way of example, a collector-emitter breakdown voltage of 13 volts and a supply voltage of 5 volts give an upper limit of the common mode input voltage range of +13.7 volts.

While the invention has been particularly shown and described with reference to a preferred embodiment thereof, it will be understood by those skilled in the art that numerous changes in form and detail may be made therein without departing from the spirit and scope of the invention.

We claim:

1. A voltage comparator circuit having a wide common mode input voltage range, comprising:
   a pair of input terminals for receiving the voltages to be compared;
   input stage means including two input transistors each having a base, emitter and collector electrode with the emitter electrodes of said input transistors respectively coupled to said input terminals and with said collector electrodes respectively connected to two current sources;
   current fixing circuit means coupled to said base electrodes and arranged to fix the direct current of said collector electrodes of said input transistors at a first value I0 and the currents supplied by the current sources at a second value k I0, with k>2; and
   output stage means connected to the said collector electrodes, said output stage means producing a first binary logic level at the output thereof if the voltage at the first of said pair of input terminals is greater than the voltage at the second of said pair of input terminals, and producing a second binary logic level at the output thereof if the voltage at the second of said pair of input terminals is greater than the voltage at the first of said pair of input terminals.

2. The voltage comparator circuit as set forth in claim 1 wherein said two input transistors are of the NPN type and wherein said two current sources are PNP transistors, said PNP transistors each having a base, emitter and collector electrode with the emitter electrodes connected to a first supply voltage, the collector electrodes respectively connected to the sid collector electrodes of said two input transistors and with the base electrodes connected together to said current fixing circuit means.

3. The voltage comparator circuit as set forth in claim 2 wherein said current fixing circuit means includes a first PNP transistor having a base, emitter and collector electrode with said base electrode connected to the said base electrodes of said two current source PNP transistors, said emitter electrode connected to said first supply voltage and with said collector electrode connected to the said base electrode of said first PNP transistor.

4. The voltage comparator circuit as set forth in claim 3 wherein said current fixing circuit means further includes a second NPN transistor having a base, emitter and collector electrode with said emitter electrode connected to a second supply voltage via a resistor means and with the collector electrode connected to the said collector electrode of said first PNP transistor.

5. The voltage comparator circuit as set forth in claim 1 wherein said input transistors are PNP type and said current sources are transistors of NPN type having their emitters connected to first supply voltage, their bases connected together to said current fixing circuit means, and their collector electrodes respectively connected to the collector electrodes of said input transistors.

6. The voltage comparator circuit as set forth in claim 5 wherein said current fixing circuit means includes a first transistor of the NPN type having an emitter, base and collector electrode with said base electrode connected to the said base electrodes of said two current sources, with said emitter electrode connected to said first supply voltage and with said base electrode further connected to said collector electrode of said first transistor.

7. The voltage comparator circuit as set forth in claim 6 wherein said current fixing circuit means further includes a second transistor having an emitter, base and collector electrode with the said collector electrode of said second transistor connected to the collector electrode of said first transistor and with the emitter electrode of said second transistor connected to a second supply voltage via a resistor.

8. A voltage comparator circuit having a wide common mode input voltage range, comprising:
a pair of input terminals for receiving the voltages to be compared;
input stage means including two input transistor each having a base, emitter and collector electrode, with the emitter electrodes of said input transistors respectively coupled to said input terminal, and with said collector electrodes respectively connected to two current sources;
current fixing circuit means coupled to the base electrodes of said input transistors, and arranged to fix the direct current of the collectors of said input transistors at a first value I0 and the current supplied by the current sources at a second value k I0, with k>2; and,
output stage means connected to the collector electrodes of said two input transistors, said output stage means producing a first binary logic level at the output thereof if the voltage at the first of said pairs of input terminals is greater than the voltage at the second of said pair of input terminals, and producing a second binary logic level at the output thereof if the voltage at the second of said pair of input terminals is greater than the voltage at the first of said pair of input terminals;
said two input transistors being of the NPN type with said two current sources being PNP transistors, said PNP current source transistors each having a base emitter and collector electrode with the emitter electrodes of said current source transistors connected to a first supply voltage, a collector electrodes of said current source transistors respectively connected to the collector electrodes of said input transistors and the base electrodes of said current source transistors connected together to said current fixing circuit means;
said current fixing circuit means including a first PNP transistor having a base emitter and collector electrode with said base electrodes of said first PNP transistor being connected to the base electrode of said two current source PNP transistors, said emitter electrode being connected to said first supply voltage and said collector electrode being connected to the base electrode of said first PNP transistor, and further including a second NPN transistor having a base, emitter and collector electrode with the emitter electrode of said second NPN transistor being connected to a second supply voltage via a resistor means and with the collector electrode of said second NPN transistor being connected to the collector electrode of said first PNP transistor,
said current fixing circuit means further including a current mirror arrangement which comprises at least two third transistors of the PNP type, each having an emitter, base and collector electrode with said emitter electrodes of said third transistors being connected to said first supply voltage and said base electrodes of said third transistors being connected to the collector electrodes of said two transistors and to the base electrode of said second transistor, and a fourth transistor having an emitter, base and collector electrode with the base electrode of said fourth transistor being connected to the electrodes of said third transistors and with the emitter electrode of said fourth transistor being connected to said first supply voltage, and with the collector electrode of said fourth transistor being connected to said base electrodes of said input transistors.

9. The voltage comparator circuit as set forth in claim 8 wherein said first supply voltage is positive and said second supply voltage is ground.

10. A voltage comparator circuit having a wide common mode input voltage range, comprising:
a pair of input terminals for receiving the voltages to be compared;
input stage means including two input transistors each having a base, emitter and collector electrode, with the emitter electrodes of said input transistors respectively coupled to said input terminal, and with said collector electrodes respectively connected to two current sources;

current fixing circuit means coupled to the base electrodes of said input transistors and arranged to fix the direct current of the collector electrodes of said input transistors at a first value I0 and the current supplied by the current sources at a second value k I0, with k>2; and, output stage means connected to the collector electrodes of said two input transistors, said output stage means producing a first binary logic level at the output thereof if the voltage at the first of said pairs of input terminals is greater than the voltage at the second of said pair of input terminals, and producing a second binary logic level at the output thereof if the voltage at the second of said pair of input terminals is greater than the voltage at the first of said pair of input terminals;

said two input transistors being of the PNP type and said two current sources being of the NPN type, said NPN current source transistors having their emitters connected to a first supply voltage, their bases connected together to said current fixing circuit means and their collector electrodes respectively connected to the collector electrodes of said input transistors;

said current fixing circuit means including a first transistor of the NPN type having an emitter, base and collector electrode with said base electrode connected to the base electrodes of said two current source NPN transistors with said emitter electrode connected to said first supply voltage and with said electrode connected to the collector electrode of said first transistor;

said current fixing circuit means further including a second transistor of the PNP type, having an emitter, base and collector electrode with the collector electrode of said second transistor being connected to the collector electrode of said first transistor and with the emitter electrode of said second transistor being connected to said second supply voltage via a resistor, said current fixing circuit means further including a current mirror arrangement which comprises at least two third transistors of the NPN type, each having an emitter, base and collector electrode with said emitter electrodes connected to said second supply voltage and said base electrodes connected to the collector electrodes of said two second transistor, and a fourth transistor having an emitter, base and collector electrode where the base electrode of the fourth transistor being connected to the base electrode of said third transistors and with the emitter electrode of said fourth transistor being connected to the first supply voltage.

11. The voltage comparator circuit as set forth in claim 10 wherein said first supply voltage is positive and said second supply voltage is grounded.

* * * * *